(12) United States Patent
Mantegazza

(10) Patent No.: US 11,081,151 B2
(45) Date of Patent: Aug. 3, 2021

(54) TECHNIQUES TO IMPROVE A READ OPERATION TO A MEMORY ARRAY

(71) Applicant: Intel Corporation, Santa Clara, CA (US)

(72) Inventor: Davide Mantegazza, Palo Alto, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/584,339

(22) Filed: Sep. 26, 2019

(65) Prior Publication Data

US 2021/0098034 A1   Apr. 1, 2021

(51) Int. Cl.
| | | |
|---|---|---|
| *G11C 7/10* | (2006.01) | |
| *G11C 8/10* | (2006.01) | |
| *G11C 7/12* | (2006.01) | |
| *G11C 8/08* | (2006.01) | |

(52) U.S. Cl.
CPC .............. *G11C 7/1051* (2013.01); *G11C 7/12* (2013.01); *G11C 8/08* (2013.01); *G11C 8/10* (2013.01)

(58) Field of Classification Search
CPC ........... G11C 7/1051; G11C 8/08; G11C 7/12; G11C 8/10
See application file for complete search history.

(56) References Cited

U.S. PATENT DOCUMENTS

| | | | | |
|---|---|---|---|---|
| 2006/0133125 A1* | 6/2006 | So | ....................... | G11C 11/1653 365/63 |
| 2019/0043923 A1* | 2/2019 | Ahmed | ................ | G11C 13/003 |
| 2019/0279709 A1* | 9/2019 | Lee | ........................ | G11C 13/004 |
| 2019/0279712 A1* | 9/2019 | Siau | ..................... | G11C 13/0011 |

\* cited by examiner

*Primary Examiner* — Ajay Ojha
(74) *Attorney, Agent, or Firm* — Compass IP Law PC

(57) ABSTRACT

Examples may include techniques to improve a read operation to a memory array. Examples include identifying characteristics of memory cells in the memory array such as relative positions of memory cells within the memory array and then set multiple read reference voltages or currents to detect a memory state of memory cells based on identified characteristics.

15 Claims, 10 Drawing Sheets

System 100

Array Portion 400

Read Current Profiles 500
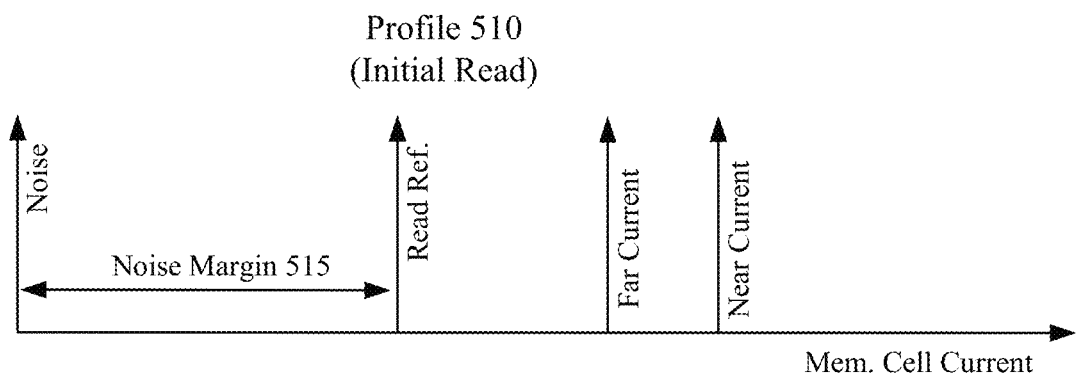
Profile 510
(Initial Read)
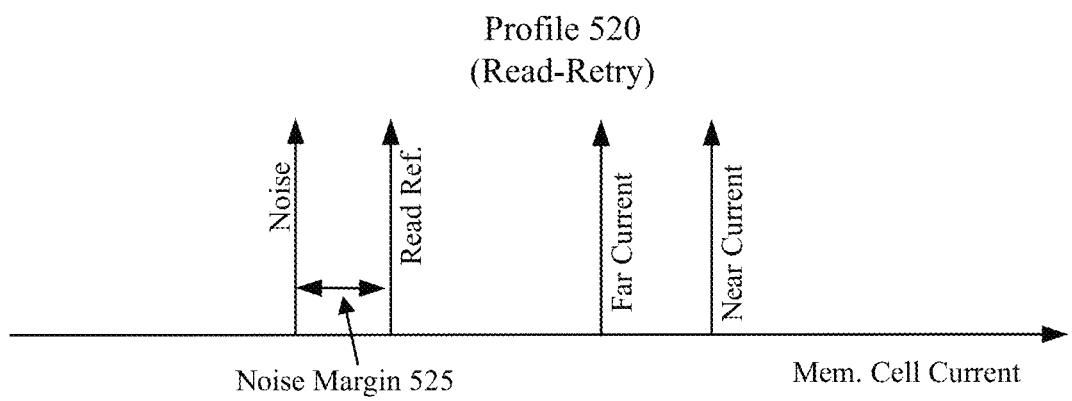
Profile 520
(Read-Retry)
*FIG. 5*

Read Current Profiles 600
Profile 610
(Initial Read)
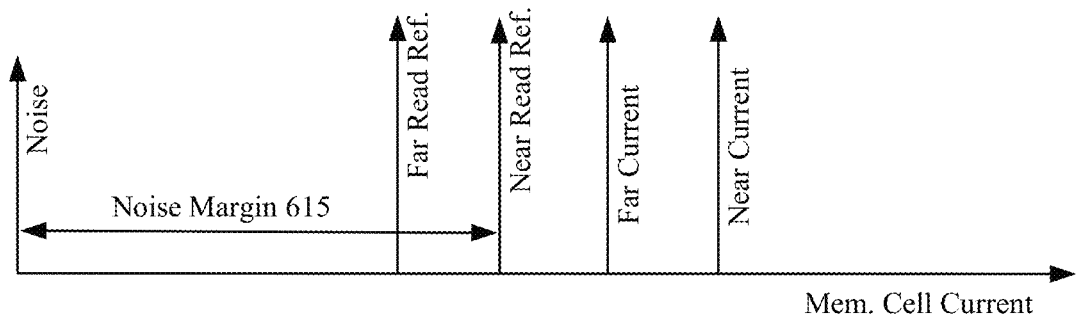
Profile 620
(Read-Retry)
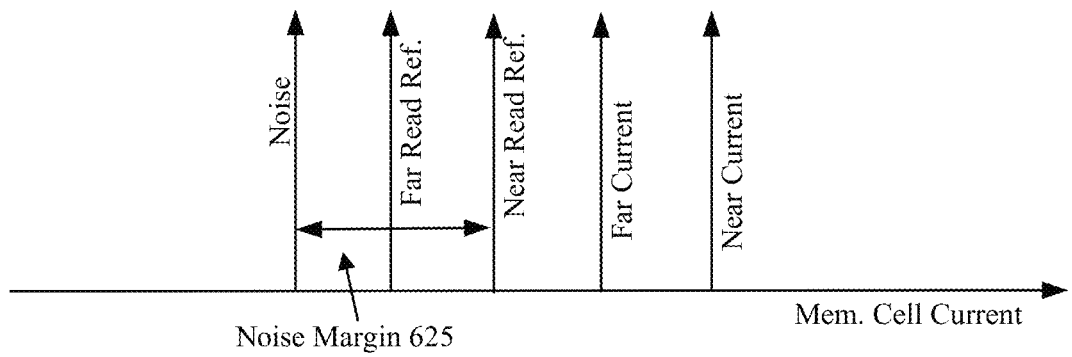
*FIG. 6*

800

IDENTIFY A FIRST PORTION OF MEMORY CELLS OF A MEMORY ARRAY AS HAVING A FIRST CHARACTERISTIC TO SET A FIRST READ REFERENCE VOLTAGE OR CURRENT TO DETECT A MEMORY STATE OF MEMORY CELLS INCLUDED IN THE FIRST PORTION OR MEMORY CELLS DURING READ OPERATIONS TO THE MEMORY ARRAY
802

IDENTIFY A SECOND PORTION OF MEMORY CELLS OF THE MEMORY ARRAY AS HAVING A SECOND CHARACTERISTIC TO SET A SECOND READ REFERENCE VOLTAGE OR CURRENT TO DETECT A MEMORY STATE OF MEMORY CELLS INCLUDED IN THE SECOND PORTION OF MEMORY CELLS DURING READ OPERATIONS TO THE MEMORY ARRAY
804

*FIG. 8*

Storage Medium 900

Computer Executable Instructions for 800

FIG. 9

TECHNIQUES TO IMPROVE A READ OPERATION TO A MEMORY ARRAY

TECHNICAL FIELD

Examples described herein are generally related to techniques to improve a read operation to a memory array included on a memory device.

BACKGROUND

Types of memory such as non-volatile memory may have memory cells that include resistive memory elements that may be capable of storing two or more logic values (e.g., a logic "1" or "0"). A read operation to a memory cell that includes a resistive memory element generally involves applying a current or voltage to a resistive memory element to be read and then detecting an output current or voltage. An amplitude of the detected output current or voltage is then used to determine a state of a the resistive memory element. The state, for example, may be a "SET" state having a logical value of "1" or a "RESET" state having a logical value of "0". A threshold amplitude used to distinguish a state of a resistive memory element is commonly referred to as a read reference current or voltage. Typically, a read reference current or voltage is constant or the same amplitude for all resistive memory elements of a memory array.

BRIEF DESCRIPTION OF THE DRAWINGS

FIG. 5 illustrates example first read current profiles.
FIG. 6 illustrates example second read current profiles.
FIG. 8 illustrates an example of a logic flow.
FIG. 9 illustrates an example of a storage medium.

DETAILED DESCRIPTION

As mentioned above, a read reference current or voltage is used as a threshold amplitude to distinguish a state of a resistive memory element and the read reference current or voltage is typically constant or is a same amplitude for all resistive memory elements of a memory array. In some examples, the memory array may include memory cells arranged in a single level memory array or in a multi-level or 3-dimensional (3D) memory array. An example of a type of 3D memory array may be a 3D cross-point memory structure. A memory cell of a single level or 3D memory array may include a resistive memory element capable of storing data (e.g., logic levels) that may be accessed when voltages or current are applied to a word line (WL) and a bit line (BL) coupled to the memory cell. A memory cell is referred to as being "selected" by applying a bias voltage or current to a cross-point of a WL and BL coupled to the selected memory cell.

In some examples of where a current is used to read a memory cell, depending on the memory cell's position in a memory array, a different current can be generated for a memory cell read as SET (logical value of "1") during a read operation. The different current can be generated based on higher currents being used for memory cells positioned closer to BL or WL contacts and/or decoder or decoding circuitry of a memory array. For example, higher minimum hold currents (Ihold) for memory cells selected for a read operation are typically needed for memory cells located closer to BL or WL contacts and/or decoder circuitry (near memory cells) than for memory cells located farther from these parts of a memory array (far memory cells). The higher Ihold currents used for near memory cells may be problematic when a read-retry operation is attempted for these near memory cells. The read-retry operation typically uses a higher read bias or higher read current that is applied to the BL or WL coupled to a near memory cell. The higher read current applied to the BL or WL increases current leakage from deselected memory cells coupled to the BL or WL. The increased current leakage from deselected memory cells may cause enough signal noise to make a selected memory cell that is in a RESET state appear to be in a SET state because the signal noise may surpass or exceed a read reference current or voltage for detecting a SET state. The incorrectly read state of the memory cell may then lead to a bit error for reading data stored to a memory array. If multiple memory cells have bit errors following a read-retry, then data stored to a memory array may be deemed as corrupt or uncorrectable. Examples described in this disclose include techniques to mitigate potential problems caused by use of a single read reference current or voltage for read operations to memory cells of a memory array by using multiple read reference currents or voltages that depend, in some examples, on a memory cell's relative position in a memory array.

Figure 1:
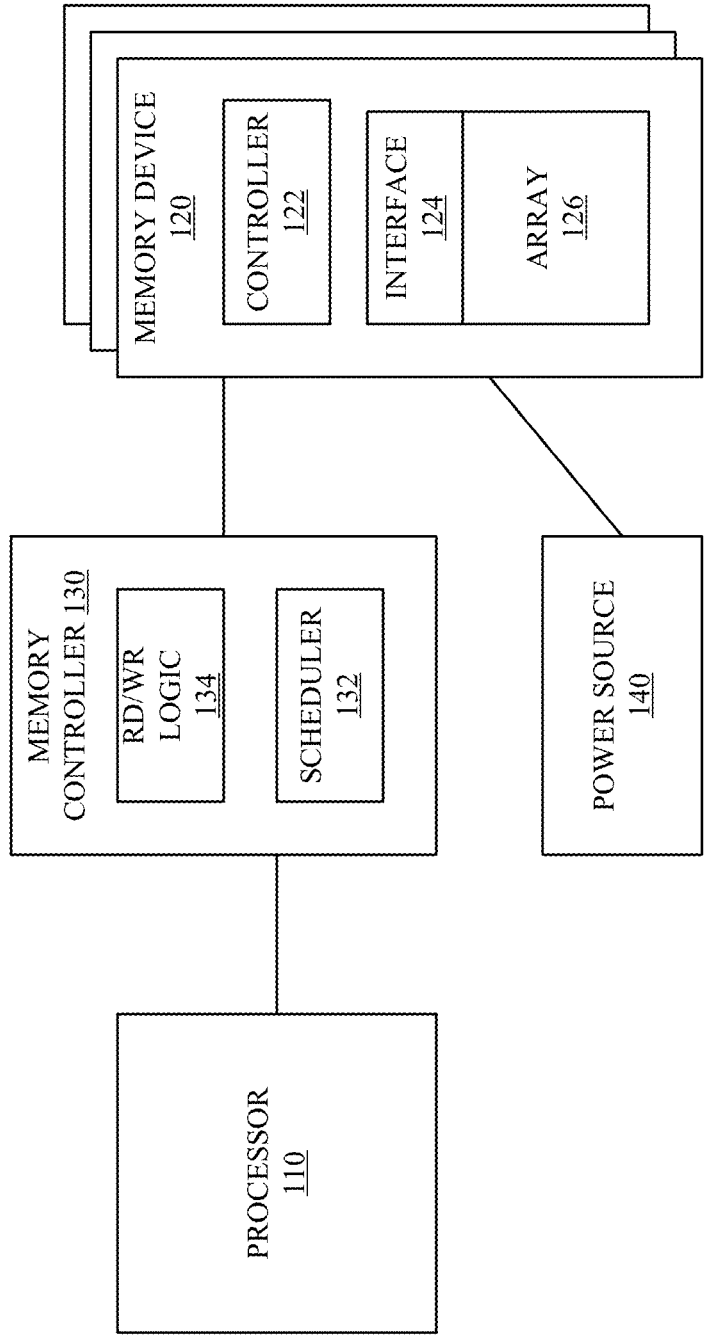
FIG. 1 illustrates an example system.

FIG. 1 illustrates an example system 100. In some examples, as shown in FIG. 1, system 100 includes components of a memory subsystem having a memory device 120 to store and provide data in response to operations of processor 110. In some examples, memory device 120 receives memory access requests from a host or a processor 110, which is processing logic that executes operations based on data stored in memory device 120 or generates data to store in memory device 120. Processor 110 may include a host processor, central processing unit (CPU), microcontroller or microprocessor, graphics processor, peripheral processor, application specific processor, or another processor, and can be single core or multicore.

According to some examples, system 100 includes a memory controller 130, which represents logic to interface with memory device 120 and manage access to data stored at memory device 120. In some examples, memory controller 130 may be integrated with processor 110. In some examples, memory controller 130 may be standalone hardware, separate from processor 110. In some examples, memory controller 130 may be arranged as a separate circuit on a substrate that includes processor 110. In some examples, memory controller 130 may be a separate die or chip integrated on a common substrate with processor 110 (e.g., as a system on a chip (SoC)). In some examples, at least some of memory device 120 may be included on an SoC with memory controller 130 and/or processor 110.

In some examples, memory controller 130 includes read/write (RD/WR) logic 134, which may include hardware to interface with memory device 120. For these examples, RD/WR logic 134 may enable memory controller 130 to generate read and write commands to service requests for data access generated by the execution of instructions by processor 110. Memory controller 130 may also include a scheduler 132 to schedule sending of access commands to memory device 120 based on known timing parameters for read and write access for memory device 120. Known timing parameters can be those that are preprogrammed or otherwise preconfigured into elements of system 100 such as processor 110 and/or memory controller 130. Alternatively, such parameters may be stored at memory device 120 and accessed by memory controller 130. In some examples, at least some parameters may be determined by synchronization procedures. Timing parameters, for example, may include timing associated with write latency for memory device 120. The write latency for memory device 120 can depend on the type of memory technology.

In some examples, as shown in FIG. 1, memory device 120 includes an array 126. Array 126 may include, but is not limited to, non-volatile types of memory. These non-volatile types of memory included in array 126 may have memory cells that include resistive memory elements composed of materials that enable accessing a value of a memory cell, such as detecting changes in resistance of the memory cell to determine the value. For example, a phase change material (PCM) such as, but not limited to, a chalcogenide glass that may be switched between crystalline and amorphous states with the application of heat produced by an electric current or voltage applied to a selected memory cell. A state (e.g., crystalline/amorphous) of a phase change material may correspond with a logical value (e.g., 1 or 0) of a selected or targeted memory cell. Examples are not limited to non-volatile types of memory arrays that include memory cells having a phase change material as resistive memory elements. In some examples, other types of non-volatile memory arrays are contemplated by this disclosure. These other types of resistive non-volatile memory arrays may include, but are not limited to, a nanowire memory array, a ferroelectric transistor random access memory (FeTRAM) array, an anti-ferroelectric memory array, a resistive memory array including a metal oxide base, an oxygen vacancy base and a conductive bridge random access memory (CB-RAM) array, a spintronic magnetic junction memory array, a magnetic tunneling junction (MTJ) memory array, a domain wall (DW) and spin orbit transfer (SOT) memory array, a thyristor based memory array, a magnetoresistive random access memory (MRAM) that incorporates memristor technology or a spin transfer torque MRAM (STT-MRAM) array or a combination of any of the above, or other resistive non-volatile memory types.

According to some examples, as shown in FIG. 1, memory device 120 includes interface 124 (e.g., interface logic) to control access to array 126. Interface 124 may include decode logic, including logic to address specific rows or columns to access at least byte addressable data stored in array 126. Interface 124 may include logic and/or features to control an amount of current or voltage provided to specific or selected memory cells of array 126 to access the selected memory cells. Thus, control over access to array 126 may occur through driver and/or other access logic and/or features of interface 124.

In some examples, memory device 120 may be resident on a single substrate (e.g., a dual in-line memory module) or resident on a single chip die. For these examples, controller 122 may represents an on-substrate or on-die controller of memory device 120 to control internal access operations to execute commands, e.g., received from memory controller 130. For example, controller 122 can control any of timing, addressing, I/O (input/output) margining, scheduling, and error correction for memory device 120. As described in more detail below, controller 122 may include logic and/or features to establish multiple read reference voltages or currents to detect states of selected memory cells for a read operation to access data maintained in array 126. Also, as described more below, the multiple read reference voltages or currents may be dependent on such characteristics as a memory cell's physical position within memory array 126.

In some examples, as shown in FIG. 1, system 100 may include a power source 140. For these examples, power source 140 may be a voltage source or regulator that provides power to memory device 120.

Figure 2:
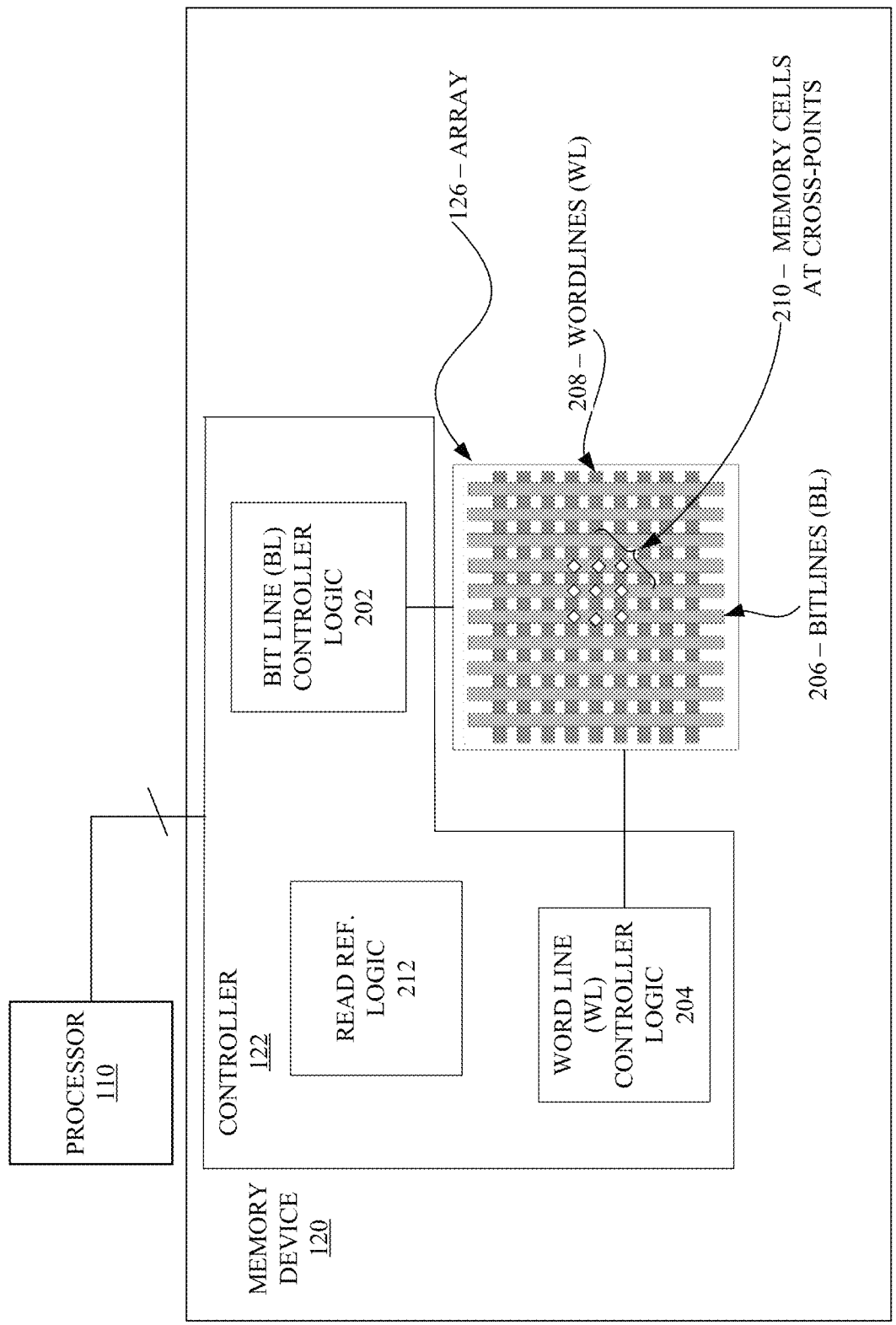
FIG. 2 illustrates further details the example system.

FIG. 2 illustrates further details of system 100. As mentioned previously, processor 110 may communicate with memory device 120 via controller 122. In some examples, array 126 may be at least a portion of a 3D cross-point memory structure that includes a plurality of word lines ("WL") 208, a plurality of bit lines ("BL") 206 and a plurality of memory cells, e.g., memory cells 210. For these examples, memory cells included in array 126 may be coupled to a WL and a BL at a location where a given WL from among WL 208 and a given BL of BL 206 cross or intersect. The memory cells included in array 126 may include resistive memory elements configured to store information and may also include memory cell select devices coupled to the resistive memory elements. Select devices may include ovonic threshold switches, diodes, bipolar junction transistors, field-effect transistors, etc.

In some examples, as shown in FIG. 2, controller 122 includes WL control logic 204, BL control logic 202 and read reference logic 212. Controller 122 may be configured to identify one or more target WLs and BLs associated with requests to access data stored to array 126. Controller 122 may be configured to manage operations of WL control logic 204 and BL control logic 202 based, at least in part, on the identified target WLs and BLs. As described more below, read reference logic 212 of controller 122 may include logic and/or features to determine multiple read reference voltages to mitigate signal noise issues during a read operation to selected memory cells of array 126 due to memory cell characteristics such as, but not limited to, relative positions of memory cells to BL driver circuitry for BL 206 and/or WL driver circuitry for WL 208.

Figure 3:
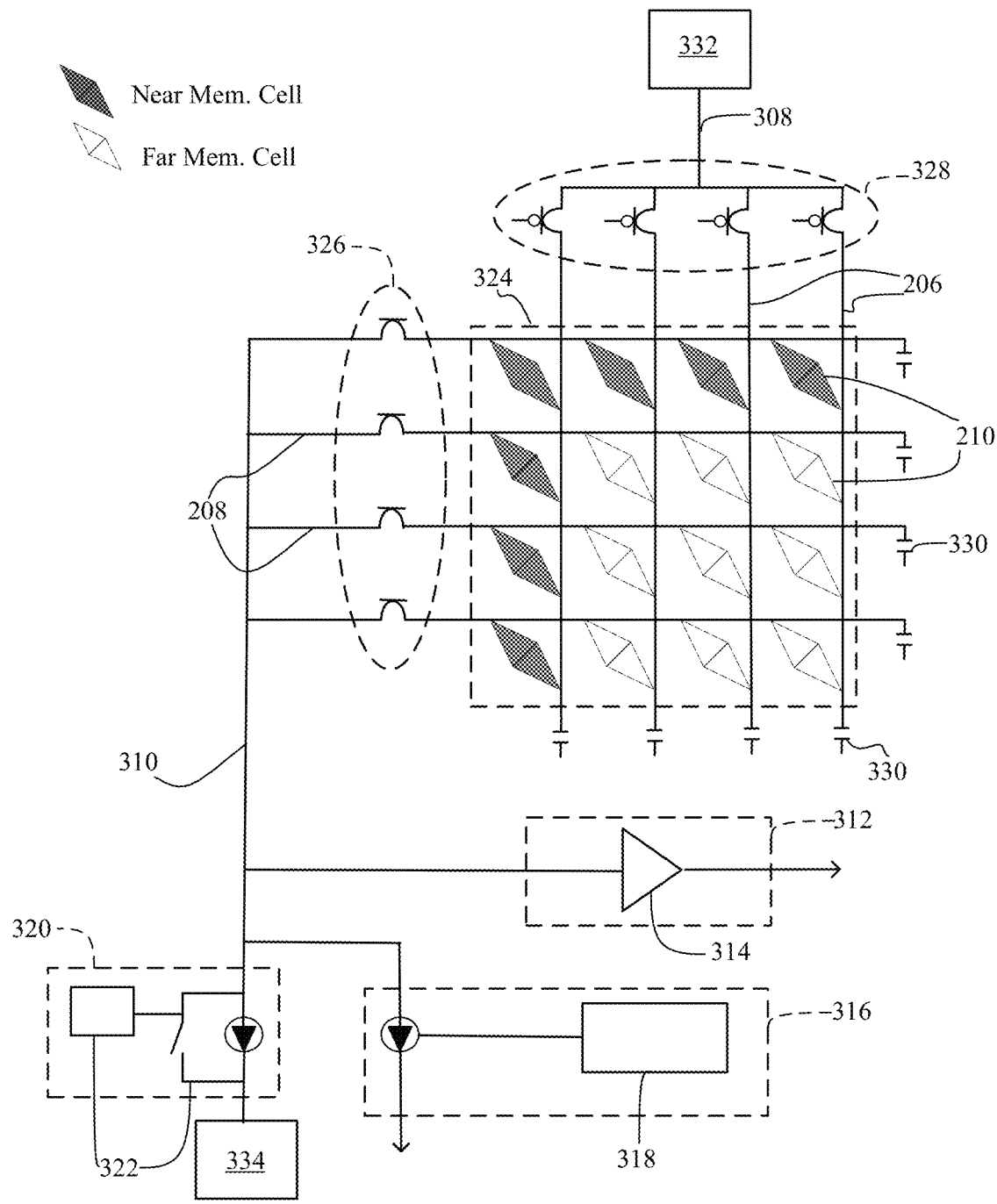
FIG. 3 illustrate an example array.

FIG. 3 illustrates example array 126. In some examples, as shown in FIG. 3, array 126 includes memory cells 210. Memory cells 210 may include, for example, a phase change material such as, but not limited to, a chalcogenide glass. A state (e.g., crystalline/amorphous) of a phase change material may correspond with a logical value maintained in a memory cell from among memory cells 210. For example, a value of 1 for a SET state or a value of 0 for a RESET state.

According to some examples, as mentioned above for FIG. 2 and also shown in FIG. 3, array 126 includes BL 206 and WL 208 coupled to memory cells 210. Also as mentioned above, BL 206 and WL 208 may be configured such that each memory cell included in memory cells 210 may be disposed where a bit-line and a word-line from among BL 206 and WL 208 cross. Voltage or current biases may be applied to a targeted memory cell of memory cells 210 using a word-line from WL 208 and a bit-line from among BL 206 to access the targeted memory cell for a write or a read operation. Respective bit-line drivers 328 may be coupled to respective BL 206 and respective word-line drivers 326 may be coupled to respective WL 208 to facilitate decoding/selection of memory cells 210, as shown in FIG. 3. Also, respective capacitors 330 may be coupled to respective BL 206 and respective WL 208, as shown in FIG. 3.

In some examples, array 126 may be part of a memory device or memory die that includes one or more tiles 324. For these examples, the one or more tiles 324 may be arranged as a portion of a memory array that includes WL 208, BL 206, and memory cells 210 that may be treated as a discrete unit during a selection operation of a targeted memory cell. That is, in some examples, each of the one or more tiles 324 is a unit of the memory array that is biased to select one or more target memory cells (e.g., a bit or bits) in the array. The one or more tiles 324 shown in FIG. 1 may include an array of four word-lines and four bit-lines (4WL× 4BL); however, other tile sizes may be used in other examples having either equal ratios of word-lines and bit-lines or unequal ratios (e.g., 2 WL for every 1 BL or 2 BL for every 1 WL). The one or more tiles 324 may be part of any memory layer of a stacked memory configuration. For example, the one or more tiles 324 may be part of a memory layer formed on another memory layer. Additional word-line drivers and/or bit-lines drivers may be provided for each memory layer or may be shared between memory layers.

According to some examples, BL 206 may couple with a bit-line electrode or path 308, which may further couple with a bit-line supply 332 that is configured to provide an electrical supply for BL 206. Also, WL 208 may couple to a word-line electrode or path 310, which may further couple with a word-line supply 334 that is configured to provide an electrical supply for WL 208. Bit-line electrode 308 and the word-line electrode 310 may each be a current path to memory cells 210. Word-line drivers 326 and bit-line drivers 328 may each include single or multiple transistors per electrode according to various examples. For examples where multiple transistors are used for word-line drivers 326 and bit-line drivers 328, the multiple transistors may be coupled to additional voltage supplies using additional word-line and/or bit-line electrodes that may similarly comport with examples described herein. For example, a first word-line electrode may provide a first voltage supply to generate a first read reference voltage or current for read operations to one or more first selected memory cells and a second word-line electrode may provide a second voltage supply to generate a second read reference voltage or current for one or more second selected memory cells for read operations.

In some examples, logic and/or features of a controller such a read reference logic 212 of controller 122 may use characteristics of memory cells 210 such as a physical location of a memory cell relative to bit-line electrode 308 and/or word-line electrode 310 to determine whether to provide a first or a second read reference voltage. For example, as shown in FIG. 3, shaded memory cells may be identified as near memory cells due to their closer proximity or distance to bit-line electrode 308 or word-line electrode 310 compared to non-shaded memory cells that may be identified as far memory cells. As mentioned more below, near and far characterizations and use of different read reference voltages or currents during a read operation may mitigate noise to signal issues. In particular, noise to signal issues for near memory cells that have higher Iholds than far memory cells. The higher Iholds may be due to bit-line or word-line characteristics that result in a need for higher Iholds on near memory cells in order to provide sufficient currents to maintain a far memory cell's selected state for a read operation. For example, resistivity characteristics of BL 206 or WL 208 that causes a degradation in current the farther a memory cell is located from respective bit-line electrode 308 or word-line electrode 310. Examples are not limited to location characteristics in relation to bit-line or word-line electrodes to determine which read reference voltage or current to use for a read operation of a near or far memory cell. Other characteristics such as, but not limited to, operating heat characteristics of memory cells, a tile layer of a memory cell, a die position for a memory die that includes a memory cell or a partition location of a memory cell.

In some examples, array 126 includes sensing circuitry 312 coupled to word-line electrode 310. For these examples, sensing circuitry 312 may use word-line electrode 310 as an electrical node for performing a read operation, such as a sense operation, of one or more memory cells included in memory cells 210. Sensing circuitry 312 may include a voltage comparator 314. For example, sensing circuitry 312 may include a word-line load connected to word-line electrode 310 to convert a current on the word-line electrode 310 to a voltage that is a first input to the voltage comparator 314. An equivalent word-line load may be connected to a reference current (not shown) to provide a voltage that is a second input to voltage comparator 314. When a particular word-line and bit-line are selected in array 126, the word-line load on word-line electrode 310 may convert the current on the selected word-line to a voltage. Capacitive components of the current may be mitigated by allowing sufficient time for the capacitive components to dissipate. The current that is converted to the first input to voltage comparator 314 may correspond with the current of the selected or targeted memory cell. Examples are not limited to having sense circuitry 312 using a word-line electrode such as word-line electrode 310 to perform a sense operation. In other examples sense circuitry may use a bit-line electrode such as bit-line electrode 308 to perform a sense operation.

According to some examples, array 126 may also include write circuitry 316 coupled to word-line electrode 310. Write circuitry 316 may use word-line electrode 310 as an electrical node for performing a write operation, such as a SET or RESET operation, of one or more memory cells from among memory cells 210. Write circuitry 316 may include a current profile generator 318 that generates a current profile for performing the write operation. Examples are not limited to having write circuitry 316 using a word-line electrode such as word-line electrode 310 to perform a write operation. In other examples write circuitry may use a bit-line electrode such as bit-line electrode 308 to perform a sense operation.

In some examples, array 126 may also include components of a selection module 320 coupled to word-line electrode 310. Current-limiting circuitry 322 of selection module 320 may be coupled to word-line electrode 310 to facilitate a selection operation of one or more memory cells of memory cells 210 using word-line electrode 310. The selection operation may precede a read/write operation and place the targeted memory cell in a state to receive a read/write operation. During selection, a targeted memory cell may be moved from a sub-threshold region of operation to a region of operation above a threshold region of operation by applying a selection voltage or current (Ihold) bias across the targeted memory cell. The voltage or current bias to achieve and maintain selection of the targeted memory cell may be provided by word-line and bit-line driver circuitry (e.g., of the selection module 320) of the respective word-line and bit-line for the targeted memory cell in conjunction with current-limiting circuitry 322. Current-limiting circuitry 322 may limit the current of word-line electrode 310 to prevent damaging the selected memory cell with excessive current. That is, limiting the maximum current of word-line electrode 310 may also limit the maximum current through memory cells 210. In other examples current-limiting circuitry 322 may use a bit-line electrode such as bit-line electrode 308 to protect memory cells from excessive current.

In some examples, current-limiting circuitry 322 may include a current mirror circuit (not shown). Current-limiting circuitry 322 may include a transistor gate that is configured to limit a current of word-line electrode 310 to a maximum current level. For example, the transistor may be an n-type transistor having a gate that is controlled to an analog level such that the transistor delivers up to a maximum desired current. Current-limiting circuitry 322 may be enabled by applying a gate voltage to the transistor. Selection module 320 may include additional control circuitry to facilitate decoding of a target memory cell of the one or more memory cells 210 such that the targeted memory cell is moved from a subthreshold region of operation to a region of operation above a voltage threshold (Vt), where Vt is a function of current.

Figure 4:
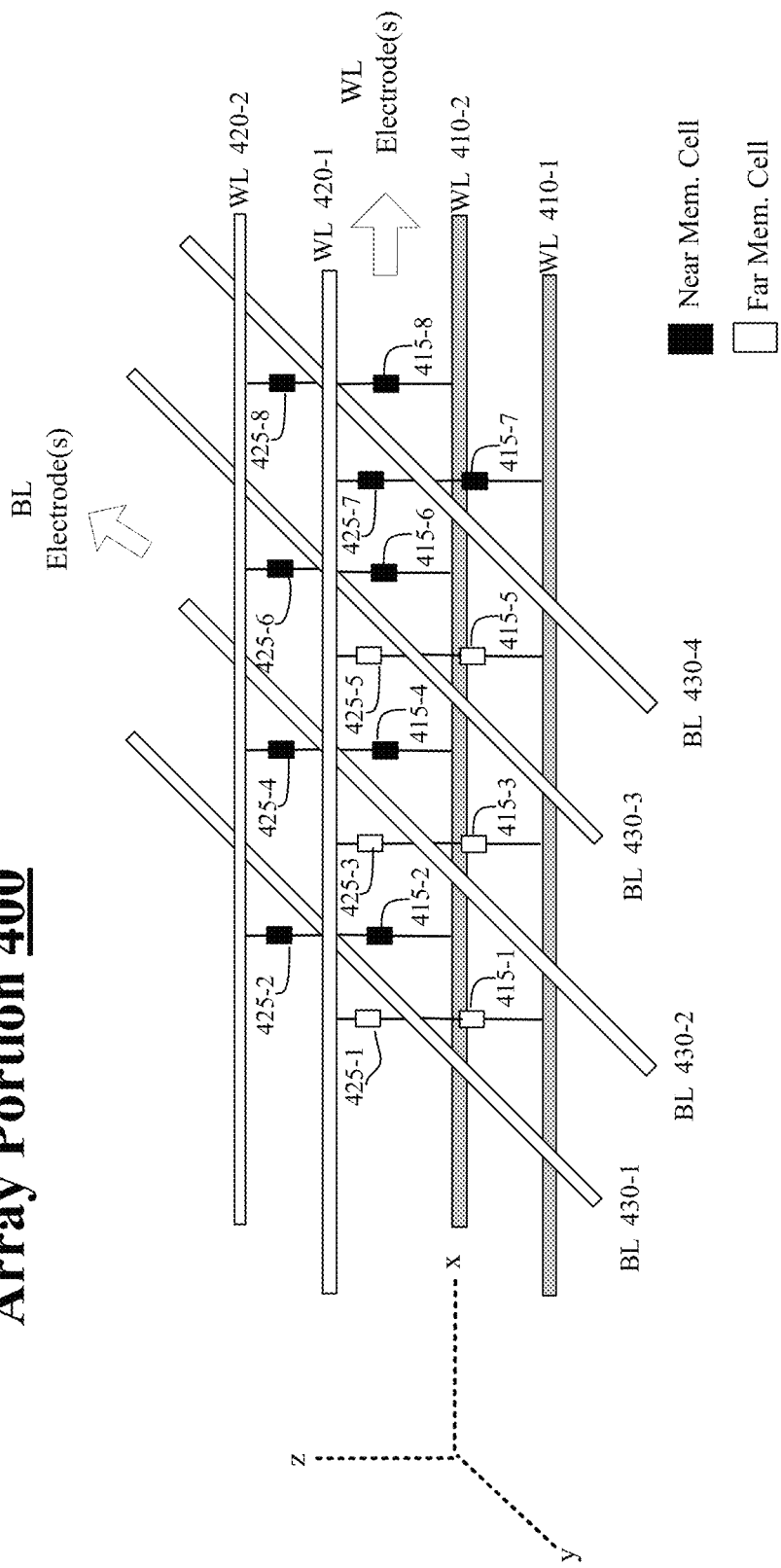
FIG. 4 illustrates an example array portion.

FIG. 4 illustrates an example array portion 400. In some examples, array portion 400 as shown in FIG. 4, includes memory cells arranged in two layers or decks. The first deck includes memory cells 415-1 to 415-8 coupled to WLs 410-1 and 410-2 and coupled to BLs 430-1 to 430-4. The second deck includes memory cells 425-1 to 425-8 coupled to WLs 420-1 and 420-2 and to BLs 430-1 to 430-4. For these examples, as shown in FIG. 4, WLs 410-½ and 420-½ may be arranged along an x-axis, BLs 430-1 to 430-4 along a y-axis and the two decks may be along a z-axis in relation to each other. Hence, array portion 400 may represent a portion of a 3D cross-point memory structure.

According to some examples, similar to array 126 shown in FIG. 3, memory cells may be characterized as a near memory cell if they are located in relatively closer proximity or distance to either BL electrode(s) or WL electrode(s) as compared to other memory cells characterized as far memory cells. For these examples, as shown in FIG. 4, memory cells 415-2, 415-4, 415-6 and 415-8 for the first deck or layer are characterized as near memory cells due to their closer proximity or distance to BL electrode(s) and memory cells 415-7 and 415-8 due to closer proximity or distance to WL electrode(s). Meanwhile, memory cells 425-2, 425-4, 425-6 and 425-8 for the second deck or layer are characterized as near memory cells due to their closer proximity or distance to BL electrode(s) and memory cells 425-7 and 425-8 due to closer proximity or distance to WL electrode(s).

In some examples, although not shown in FIG. 4, at least some logic circuitry such a decoding or sensing circuitry may be located in closer proximity or distance to either memory cells located on the first layer or deck or to memory cells located on the second layer or deck. For these examples, proximity of memory cells to the decoding or sensing circuitry may also be used to characterize cells as near or far memory cells. For example, all of memory cells 415-1 to 415-8 may be characterized as near memory cells if the decoding or sensing circuitry is closer to the first level relative to the second level. Meanwhile, only memory cells 425-2, 425-4, 425-6, 426-7 and 425-8 of the second level or deck are characterized as near memory cells based on their proximity or distance to BL or WL electrodes. Hence, a memory cell's x, y and z (layer/deck) coordinates may be relevant in determining whether a memory cell is characterized as a near or as a far memory cell.

FIG. 5 illustrates example read current profiles 500. In some examples, as shown in FIG. 5, read current profiles 500 includes a first profile 510 (Initial Read) and a second profile 520 (Read-Retry). For these examples, profile 510 compared to profile 520 illustrates how a single read reference current for memory cells characterized as near memory cells causes potential problems with a reduced noise margin, particularly for a read-retry operation. For example, as shown in FIG. 5, noise margin 515 for profile 510 may be sufficient during a read of near memory cells in a SET state to minimize a likelihood of near memory cells in a RESET state being mistakenly sensed or read as a being SET due to signal noise rising above the read reference current. However, in some examples, read-retry operations (e.g., due to detected errors in the initial read) may use a higher read current bias to re-read memory cells. The higher read current bias may cause noise margin 525 to be substantially smaller than noise margin 515 and thus the likelihood of near memory cells in a RESET state being mistakenly sensed or read as being SET is increased and may lead to an unacceptable amount of bit errors for data read from targeted or selected near memory cells.

FIG. 6 illustrates example read current profiles 600. In some examples, as shown in FIG. 6, read current profiles 600 includes a first profile 610 (Initial Read) and a second profile 620 (Read-Retry). For these examples, a far read reference current and a near read reference current may be used for a read operation instead of a single read reference current. As shown in FIG. 6, in some examples, near read reference current has a larger amplitude or current compared to far read reference current. Also, as shown in FIG. 6, although noise margin 625 is still substantially smaller than noise margin 615, the increase in the near read reference's current provides some additional noise margin as compared to using a single read reference current. The additional noise margin may reduce a likelihood of near memory cells in a RESET state being mistakenly sensed or read as being SET.

According to some examples, memory cells of a memory array may be further characterized based on relative positions in a memory array that are more granular than just near and far memory cells. For these examples, more than two read reference currents or voltages may be used for a given read current profile. For example, memory cells located in first, second, third, etc. locations zones or regions of a memory may be characterized based on a memory cell's respective location within a given location zone or region. Separate read reference currents or voltages may then be used for read operations to selected memory cells characterized as being located in these location zones or regions.

Figure 7:
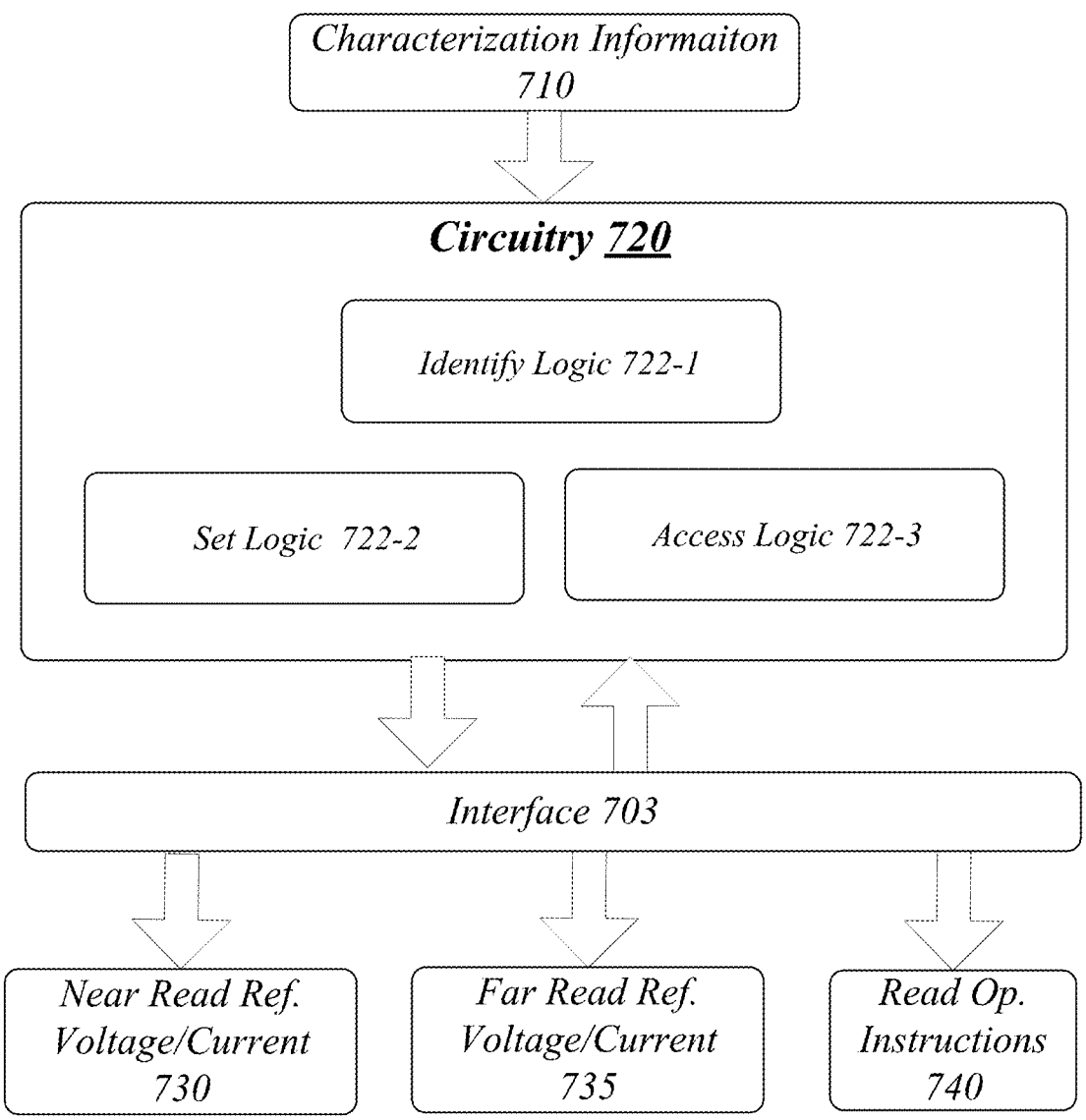
FIG. 7 illustrates an example block diagram for an apparatus.

FIG. 7 illustrates an example block diagram for an apparatus 700. Although apparatus 700 shown in FIG. 7 has a limited number of elements in a certain topology, it may be appreciated that the apparatus 700 may include more or less elements in alternate topologies as desired for a given implementation.

The apparatus 700 may be supported by circuitry 720 and apparatus 700 may be a controller maintained at a memory device or with a memory system coupled with a memory array of the memory device through an interface 703 that may also be used to access the memory cells (e.g., via read or write operations). The memory device may be coupled with or included in a host computing platform. Circuitry 720 may be arranged to execute one or more software or firmware implemented logic, components or modules 722-*a* (e.g., implemented, at least in part, by a controller of a memory device). It is worthy to note that "a" and "b" and "c" and similar designators as used herein are intended to be variables representing any positive integer. Thus, for example, if an implementation sets a value for a=3, then a complete set of software or firmware for logic, components or modules 722-*a* may include logic 722-1, 722-2 or 722-3. Also, at least a portion of "logic" may be software/firmware stored in computer-readable media, or may be implemented, at least in part in hardware and although the logic is shown in FIG. 7 as discrete boxes, this does not limit logic to storage in distinct computer-readable media components (e.g., a separate memory, etc.) or implementation by distinct hardware components (e.g., separate application-specific integrated circuits (ASICs) or field programmable gate arrays (FPGAs)).

According to some examples, circuitry 720 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples, circuitry 720 may also include one or more ASICs or FPGAs and, in some examples, at least some logic 722-a may be implemented as hardware elements of these ASICs or FPGAs.

According to some examples, apparatus 700 may include an identify logic 722-1. Identify logic 722-1 may be a logic and/or feature executed by circuitry 720 to identify a first portion of memory cells of a memory array to be accessed by logic and/or features of apparatus 700 via interface 703 as having a first characteristic and identify a second portion of the memory cells of the memory array having a second characteristic. For these examples, characterization information 710 may be used by identify logic 722-1 to determine the first and second characteristics of respective first and second portions of the memory cells. Characterization information 710 may indicate, for example, relative positions of memory cells included in the first and second portions in relation to one or more bit-line or word-line electrodes if the memory array is arranged as a cross-point memory array. For example, the first portion of memory cells may be located relatively nearer to the one or more bit-line or word-line electrodes compared to the second portion of memory cells. Also, the second portion of memory cells may be located relatively farther from the one or more bit-line or word-line electrodes compared to the first portion of memory cells.

In some examples, apparatus 700 may also include a set logic 722-2. Set logic 722-2 may be a logic and/or feature executed by circuitry 720 to set a first read reference voltage or current to detect a memory state of memory cells included in the first portion of memory cells during read operations to the memory array based on the first identified characteristic and set a second read reference voltage or current to detect a memory state of memory cells included in the second portion of memory cells during read operations to the memory array based on the second identified characteristic. For these examples, set logic 722-2 may set the first read reference voltage current and the second read reference voltage or current via sending set commands or instructions via interface 703 to decoding circuitry for the memory array. The set commands or instructions for the first read reference voltage or current may be included in near read reference voltage/current instruction 730. The set commands or instructions for the second read reference voltage or current may be included in far read reference voltage/current instruction 735.

According to some examples, apparatus 700 may also include an access logic 722-3. Access logic 722-3 may be a logic and/or feature executed by circuitry 720 to implement an access operation such as a read operation to the memory array through interface 703. For these examples, read operation instructions 740 may indicate what memory cells of the memory array are to be accessed for the read operation. The memory cells included in the first and second portions of memory cells may separately include resistive memory elements to maintain a SET state or a RESET state. A detected SET state for targeted memory cells included in the first portion of memory cells may be based on detection of a voltage or current during a read operation to the targeted memory cells included in the first portion of memory cells that exceeds the first read reference voltage or current that was set responsive to near read reference voltage/current instructions 730. A detected SET state for targeted memory cells included in the second portion of memory cells may be based on detection of a voltage or current during a read operation to the targeted memory cells included in the first portion that exceeds the second read reference voltage or current that was set responsive to far read reference voltage/current instructions 735. Detected states of the targeted memory cells may then be indicated (e.g., by decoding circuitry) to access logic 722-3. Access logic 722-3 may then determine corresponding values associated with each detected state (e.g., logical 1 for SET or logical 0 for RESET).

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 8 illustrates an example of a logic flow 800. Logic flow 800 may be representative of some or all of the operations executed by one or more logic, features, or devices described herein, such as apparatus 700. More particularly, logic flow 800 may be implemented by one or more of identify logic 722-1 or set logic 722-2.

According to some examples, logic flow 800 at block 802 may identify a first portion of memory cells of a memory array as having a first characteristic to set a first read reference voltage or current to detect a memory state of memory cells included in the first portion or memory cells during read operations to the memory array. For these examples, identify logic 722-1 may identify the first characteristic and set logic 722-2 may set the first read reference voltage based on the identified first characteristic.

In some examples, logic flow 800 at block 804 may identify a second portion of memory cells of the memory array as having a second characteristic to set a second read reference voltage or current to detect a memory state of memory cells included in the second portion of memory cells during read operations to the memory array. For these examples, identify logic 722-1 may identify the second characteristics and set logic 722-2 may set the second read reference voltage based on the identified second characteristic.

FIG. 9 illustrates an example of a first storage medium. As shown in FIG. 9, the first storage medium includes a storage medium 900. The storage medium 900 may comprise an article of manufacture. In some examples, storage medium 900 may include any non-transitory computer readable medium or machine readable medium, such as an optical, magnetic or semiconductor storage. Storage medium 900 may store various types of computer executable instructions, such as instructions to implement logic flow 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 10:
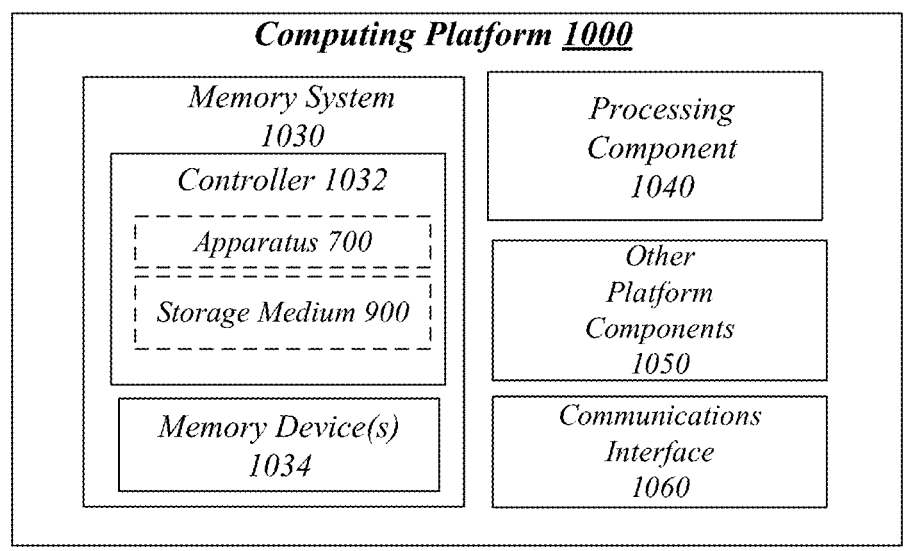
FIG. 10 illustrates an example computing platform.

FIG. 10 illustrates an example computing platform 1000. In some examples, as shown in FIG. 10, computing platform 1000 may include a memory system 1030, a processing component 1040, other platform components 1050 or a communications interface 1060. According to some examples, computing platform 1000 may be implemented in a computing device.

According to some examples, memory system 1030 may include a controller 1032 and memory devices(s) 1034. For these examples, logic and/or features resident at or located at controller 1032 may execute at least some processing operations or logic for apparatus 700 and may include storage media that includes storage medium 900. Also, memory device(s) 1034 may include similar types of non-volatile memory (not shown) that are described above for system 100, array 126, or array portion 400 shown in FIGS. 1-4. In some examples, controller 1032 may be part of a same die with memory device(s) 1034. In other examples, controller 1032 and memory device(s) 1034 may be located on a same die and located on a same substrate or die with a processor (e.g., included in processing component 1040). In yet other examples, controller 1032 may be in a separate die or integrated circuit coupled with memory device(s) 1034.

According to some examples, processing component 1040 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1050 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1050 or memory system 1030 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristors, STT-MRAM, magnetic or optical cards, and any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2018, Carrier sense Multiple access with Collision Detection (CSMA/CD) Access Method and Physical Layer Specifications, Published in August 2018 (the "IEEE 802.3-2018 specification").

Computing platform 1000 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1000 described herein, may be included or omitted in various embodiments of computing platform 1000, as suitably desired.

The components and features of computing platform 1000 may be implemented using any combination of discrete circuitry, ASICs, logic gates and/or single chip architectures. Further, the features of computing platform 1000 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

Although not depicted, any system can include and use a power supply such as but not limited to a battery, AC-DC converter at least to receive alternating current and supply direct current, renewable energy source (e.g., solar power or motion based power), or the like.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first, " "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus comprising:
  an interface to access memory cells of a cross-point memory array of a memory device, the cross-point memory array includes memory cells located at an intersection of bit-lines and word-lines, the bit-lines to have at least one bit-line electrode to provide voltage to the bit-lines, the word-lines to have at least one word-line electrode to provide voltage to the word-lines; and
  a controller for the memory device, the controller to include logic, at least a portion of which is implemented as hardware, the logic to:
    identify a first portion of memory cells of the cross-point memory array as having a first characteristic to set a first read reference voltage or current to detect a memory state of memory cells included in the first portion of memory cells during read operations to the cross-point memory array; and identify a second portion of memory cells of the cross-point memory array as having a second characteristic to set a second read reference voltage or current to detect a memory state of memory cells included in the second portion of memory cells during read operations to the cross-point memory array, wherein the memory cells included in the first and second portions of memory cells are to separately include resistive memory elements to maintain a SET state or a RESET state, a detected SET state for targeted memory cells included in the first portion of memory cells based on detection of a voltage or current during a read operation to the targeted memory cells included in the first portion of memory cells that exceeds the first read reference voltage or current, a detected SET state for targeted memory cells included in the second portion of memory cells based on detection of a voltage or current during a read operation to the targeted memory cells included in the first portion that exceeds the second read reference voltage or current.

2. The apparatus of claim 1, comprising the first characteristic is based on the first portion of memory cells physically located closer to the at least one bit-line electrode or the at least one word-line electrode compared to the second portion of memory cells, wherein the second characteristic is based on the second portion of memory cells physically located farther from the at least one bit-line electrode or the at least one word-line electrode compared to the first portion of memory cells.

3. The apparatus of claim 2, comprising the cross-point memory array included in a 3-dimensional (3D) cross-point memory structure as a first deck of the 3D cross-point memory structure that includes at least two decks.

4. The apparatus of claim 3, comprising the 3D cross-point memory structure including decoding circuitry located on a separate deck than the first deck that includes the cross-point memory array, the decoding circuitry to read a detected memory state of memory cells during read operations, the first characteristic also based on the first portion of memory cells closer to the decoding circuitry compared to the second portion of memory cells, wherein the second characteristic is also based on the second portion of memory cells physically located farther from the decoding circuitry compared to the first portion of memory cells.

5. The apparatus of claim 1, the cross-point memory array comprising a phase change memory array, a nanowire memory array, a ferroelectric transistor random access memory (FeTRAM) array, an anti-ferroelectric memory array, a resistive memory array including a metal oxide base, an oxygen vacancy base and a conductive bridge random access memory (CB-RAM) array, a spintronic magnetic junction memory array, a magnetic tunneling junction (MTJ) memory array, a domain wall (DW) and spin orbit transfer (SOT) memory array, a thyristor based memory array, a magnetoresistive random access memory (MRAM) that incorporates memristor technology or a spin transfer torque MRAM (STT-MRAM) array.

6. A method comprising:

identifying a first portion of memory cells of a cross-point memory array including memory cells located at an intersection of bit-lines and word-lines, the bit-lines having at least one bit-line electrode to provide voltage to the bit-lines, the word-lines having at least one word-line electrode to provide voltage to the word-lines, the first portion of memory cells identified based on having a first characteristic to set a first read reference voltage or current to detect a memory state of memory cells included in the first portion or memory cells during read operations to the cross-point memory array; and identifying a second portion of memory cells of the cross-point memory array based on the second portion of memory cells having a second characteristic to set a second read reference voltage or current to detect a memory state of memory cells included in the second portion of memory cells during read operations to the cross-point memory array, wherein the memory cells included in the first and second portions of memory cells are to separately include resistive memory elements to maintain a SET state or a RESET state, a detected SET state for targeted memory cells included in the first portion of memory cells based on detection of a voltage or current during a read operation to the targeted memory cells included in the first portion of memory cells that exceeds the first read reference voltage or current, a detected SET state for targeted memory cells included in the second portion of memory cells based on detection of a voltage or current during a read operation to the targeted memory cells included in the first portion that exceeds the second read reference voltage or current.

7. The method of claim 6, comprising the first characteristic is based on the first portion of memory cells physically located closer to the at least one bit-line electrode or the at least one word-line electrode compared to the second portion of memory cells, wherein the second characteristic is based on the second portion of memory cells physically located farther from the at least one bit-line electrode or the at least one word-line electrode compared to the first portion of memory cells.

8. The method of claim 7, comprising the cross-point memory array included in a 3-dimensional (3D) cross-point memory structure as a first deck of the 3D cross-point memory structure that includes at least two decks.

9. The method of claim 8, comprising the 3D cross-point memory structure including decoding circuitry located on a separate deck than the first deck that includes the cross-point memory array, the decoding circuitry to read a detected memory state of memory cells during read operations, the first characteristic also based on the first portion of memory cells closer to the decoding circuitry compared to the second portion of memory cells, wherein the second characteristic is also based on the second portion of memory cells physically located farther from the decoding circuitry compared to the first portion of memory cells.

10. The method of claim 6, the cross-point memory array comprising a phase change memory array, a nanowire memory array, a ferroelectric transistor random access memory (FeTRAM) array, an anti-ferroelectric memory array, a resistive memory array including a metal oxide base, an oxygen vacancy base and a conductive bridge random access memory (CB-RAM) array, a spintronic magnetic junction memory array, a magnetic tunneling junction (MTJ) memory array, a domain wall (DW) and spin orbit transfer (SOT) memory array, a thyristor based memory array, a magnetoresistive random access memory (MRAM) that incorporates memristor technology or a spin transfer torque MRAM (STT-MRAM) array.

11. A system comprising:
a cross-point memory array of a memory device, the cross-point memory array includes memory cells located at an intersection of bit-lines and word-lines, the bit-lines to have at least one bit-line electrode to provide voltage to the bit-lines, the word-lines to have at least one word-line electrode to provide voltage to the word-lines;
an interface to access memory cells of the cross-point memory array; and
a controller coupled with the interface, the controller to include logic, at least a portion of which is implemented as hardware, the logic to:
  identify a first portion of memory cells of the cross-point memory array as having a first characteristic to set a first read reference voltage or current to detect a memory state of memory cells included in the first portion of memory cells during read operations to the cross-point memory array; and
  identify a second portion of memory cells of the cross-point memory array as having a second characteristic to set a second read reference voltage or current to detect a memory state of memory cells included in the second portion of memory cells during read operations to the cross-point memory array,
wherein the memory cells included in the first and second portions of memory cells are to separately include resistive memory elements to maintain a SET state or a RESET state, a detected SET state for targeted memory cells included in the first portion of memory cells based on detection of a voltage or current during a read operation to the targeted memory cells included in the first portion of memory cells that exceeds the first read reference voltage or current, a detected SET state for targeted memory cells included in the second portion of memory cells based on detection of a voltage or current during a read operation to the targeted memory cells included in the first portion that exceeds the second read reference voltage or current.

12. The system of claim 4, comprising the first characteristic is based on the first portion of memory cells physically located closer to the at least one bit-line electrode or the at least one word-line electrode compared to the second portion of memory cells, wherein the second characteristic is based on the second portion of memory cells physically located farther from the at least one bit-line electrode or the at least one word-line electrode compared to the first portion of memory cells.

13. The system of claim 12, comprising the cross-point memory array included in a 3-dimensional (3D) cross-point memory structure as a first deck of the 3D cross-point memory structure that includes at least two decks.

14. The system of claim 13, comprising the 3D cross-point memory structure including decoding circuitry located on a separate deck than the first deck that includes the cross-point memory array, the decoding circuitry to read a detected memory state of memory cells during read operations, the first characteristic also based on the first portion of memory cells closer to the decoding circuitry compared to the second portion of memory cells, wherein the second characteristic is also based on the second portion of memory cells physically located farther from the decoding circuitry compared to the first portion of memory cells.

15. The system of claim 11, the cross-point memory array comprising a phase change memory array, a nanowire memory array, a ferroelectric transistor random access memory (FeTRAM) array, an anti-ferroelectric memory array, a resistive memory array including a metal oxide base, an oxygen vacancy base and a conductive bridge random access memory (CB-RAM) array, a spintronic magnetic junction memory array, a magnetic tunneling junction (MTJ) memory array, a domain wall (DW) and spin orbit transfer (SOT) memory array, a thyristor based memory array, a magnetoresistive random access memory (MRAM) that incorporates memristor technology or a spin transfer torque MRAM (STT-MRAM) array.

* * * * *